United States Patent [19]

Dobkin

[11] 4,146,903
[45] Mar. 27, 1979

[54] SYSTEM FOR LIMITING POWER DISSIPATION IN A POWER TRANSISTOR TO LESS THAN A DESTRUCTIVE LEVEL

[75] Inventor: Robert C. Dobkin, Hillsborough, Calif.

[73] Assignee: National Semiconductor Corporation, Santa Clara, Calif.

[21] Appl. No.: 833,736

[22] Filed: Sep. 16, 1977

[51] Int. Cl.² .................. H01L 23/56; H01L 29/66; H01L 29/72
[52] U.S. Cl. .................................... 357/28; 357/35; 357/36; 307/297; 307/310
[58] Field of Search .................. 357/23, 28, 35, 36; 307/297, 310

[56] References Cited

U.S. PATENT DOCUMENTS

| | | | |
|---|---|---|---|
| 3,017,520 | 1/1962 | Maupin | 357/28 |
| 3,704,398 | 11/1972 | Fukino | 357/28 |
| 3,761,787 | 9/1973 | Davis et al. | 357/36 |
| 3,958,267 | 5/1976 | Frederiksen et al. | 357/36 |
| 3,975,648 | 8/1976 | Tober et al. | 357/23 |
| 4,028,564 | 6/1977 | Streit et al. | 357/28 |

OTHER PUBLICATIONS

IBM Technical Disclosure Bulletin, vol. 18, No. 10, Mar. 1976, Lateral PNP Structure by Park et al., p. 3254.

IBM Technical Disclosure Bulletin, vol. 16 No. 11, Apr. 1974, Power Transistor by Gillett, p. 3642.

*Primary Examiner*—Andrew J. James
*Attorney, Agent, or Firm*—Brown & Martin

[57] ABSTRACT

A system for limiting power dissipation in a power transistor to less than a destructive level is disclosed. The power transistor includes a base and a power emitter in the base. The system includes a sense emitter positioned close to the power emitter in the base and a reference emitter positioned in a base at a remote position that would not be heated by the heat dissipated by the power emitter for providing an indication of the temperature gradient between the power emitter and the remote position induced by power dissipated in the power emitter by sensing the voltage difference between the sense emitter and the reference emitter. The system further includes a differential amplifier responsive to the indication of the temperature gradient for limiting power dissipation in the power transistor by reducing the power provided to the power transistor when the indication reaches a predetermined level.

11 Claims, 6 Drawing Figures

SYSTEM FOR LIMITING POWER DISSIPATION IN A POWER TRANSISTOR TO LESS THAN A DESTRUCTIVE LEVEL

CROSS REFERENCE TO RELATED APPLICATION

This application is related to applicant's co-pending application entitled "Power Transistor" filed on Sept. 15, 1977, application Ser. No. 833,519.

BACKGROUND OF THE INVENTION

The present invention generally pertains to a system for limiting power dissipation in a power transistor to less than a destructive level.

Destructive secondary breakdown in a power transistor occurs when the power being dissipated by the power emitter causes the temperature of the emitter to rise to a destructive level. The destructive power dissipation level in a power transistor is not easily calculated and/or may vary considerably between power transistors even though they have the same nominal power rating. To prevent destruction of power transistors it has been necessary to rate the operation of power transistors considerably below their capabilities.

SUMMARY OF THE INVENTION

The present invention is a system for limiting power dissipation in a power transistor to less than a destructive level. The power transistor includes a base region and a power emitter in the base. The system includes apparatus for providing an indication of the temperature gradient between the power emitter and a remote position that would not be heated by power dissipated in the power emitter; and apparatus responsive to the indication of the temperature gradient for limiting the power dissipation in the power transistor by reducing the power provided to the power transistor when such indication reaches a predetermined level.

Preferably the temperature gradient indicating apparatus includes a sense emitter positioned in the base of the power transistor sufficiently close to the power emitter for enabling the temperature of the power emitter to be indicated as a function of the voltage across the junction of the base and the sense emitter; a reference emitter positioned in the base at a remote positon that would not be heated by the heat dissipated by the power emitter for enabling the temperature at the remote position to be indicated as a function of the voltage across the junction of the base region and the reference emitter; and apparatus for sensing the voltage difference between the sense emitter and the reference emitter to provide an indication of the temperature gradient between the power emitter and the remote position induced in the power dissipated in the power emitter. This voltage difference is proportional to the temperature gradient. In one preferred embodiment a plurality of power emitters are contained in the base and the sense emitter is positioned around and between the power emitters for enabling a voltage difference proportional to the maximum instantaneous temperature gradient between the remote position and any part of the peripheries of the power emitters to be sensed.

Preferably the apparatus for limiting power dissipation in the power transistor includes a differential amplifier having input terminals respectively coupled to the sense emitter and the reference emitter and having an output terminal coupled to the base of the power transistor for controlling the drive current to the base of the power transistor; and a bias potential source having a predetermined voltage corresponding to the predetermined temperature gradient indication level for biasing the differential amplifier to reduce the drive current when the voltage difference between the sense emitter and the reference emitter reaches the predetermined voltage.

Additional features of the present invention are discussed in the description of the preferred embodiment.

DESCRIPTION OF THE PREFERRED EMBODIMENTS

Figure 1:
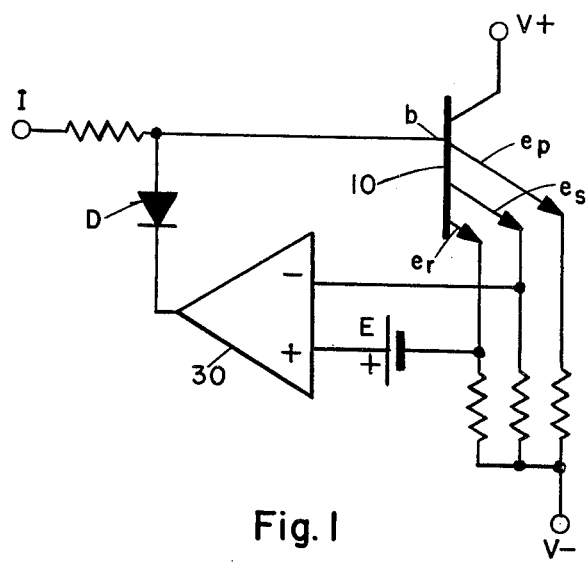
FIG. 1 is a schematic circuit diagram of the system of the present invention.

A system for limiting power dissipation in a power transistor to less than a destructive level in accordance with the present invention is shown in FIG. 1. This system utilizes a power transistor 10. The power transistor 10 includes a power emitter $e_p$, a sense emitter $e_s$ and a reference emitter $e_r$. The power emitter $e_p$ has a large power dissipation; and the sense emitter $e_s$ and the reference emitter $e_r$ both are operated at low power.

FIGS. 2 through 6 inclusive schematically illustrate various embodiments of power transistors for use in the system of FIG. 1. The power transistor of FIG. 2, includes a collector 12, a base 14 in the collector 12 and a power emitter 16 in the base 14. For the sake of clarity of illustration, conductors to collector, base and emitter terminals and the contacts by which such conductors are joined to the collector, base and emitter are not shown in the drawing.

Figure 2:
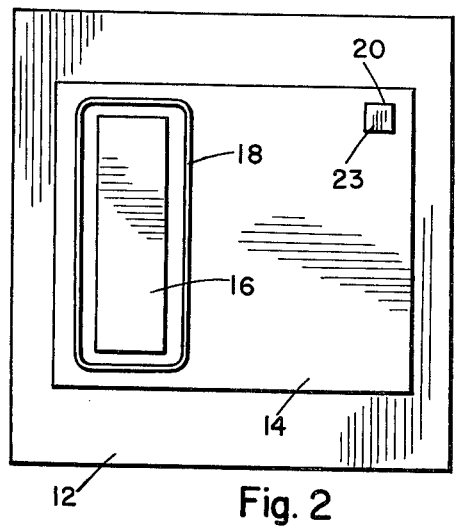
FIG. 2 is a schematic representation of one preferred embodiment of a power transistor for the system of FIG. 1.

The power transistor of FIG. 2 further includes a sense emitter 18 and a reference emitter 20, both in the base 14. The sense emitter 18 is distributed around the power emitter 16 and is sufficiently close to the power emitter 16 to enable the highest instantaneous temperature at any part of the periphery of the power emitter 16 to be indicated as a function of the voltage across the junction of the base 14 and the sense emitter 18. The reference emitter 20 is positioned in the base 14 at a remote position 23 that would not be heated by the heat dissipated by the power emitter 16 for enabling the temperature at the remote position 23 to be indicated as a function of the voltage across the junction of the base 14 and the reference emitter 20.

Figure 3:
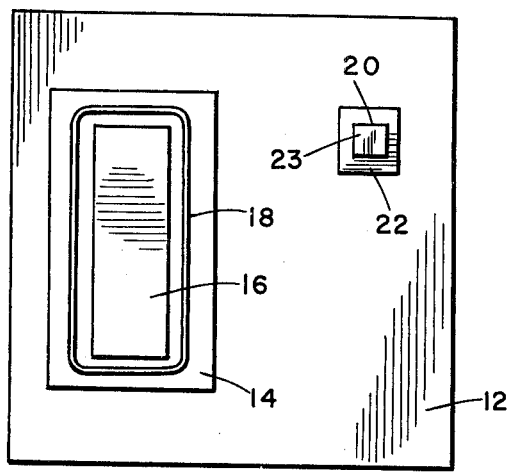
FIG. 3 is a schematic representation of an alternative preferred embodiment of a power transistor for the system of FIG. 1.

The power transistor of FIG. 3 is constructed in the same manner as the power transistor of FIG. 2, except that the reference emitter 20 is in a second base 22 that is separate from the base 14. Both the base 14 and the second base 22 are in the collector 12. The reference emitter 20 is positioned in the second base 22 at a remote position 23 that would not be heated by the heat dissipated by the power emitter 16 for enabling the temperature at the remote position 23 to be indicated as a function of the voltage across the junction of the second base 22 and the reference emitter 20.

Figure 4:
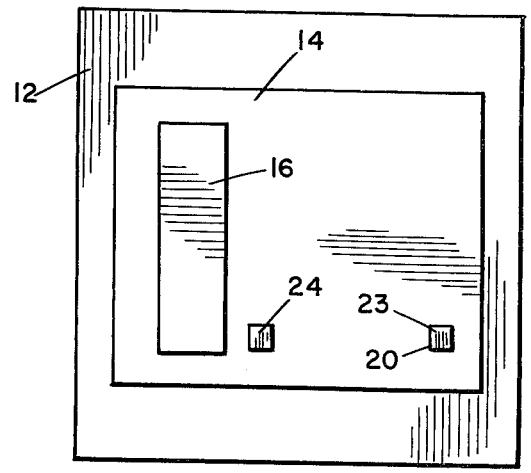
FIG. 4 is a schematic representation of another preferred embodiment of a power transistor for the system of FIG. 1.

The power transistor of FIG. 4 is constructed in the same manner as the power transistor of FIG. 2, except for the provision of a sense emitter 24 instead of the sense emitter 18. The sense emitter 24 is positioned adjacent the power emitter 16. The sense emitter 24 is sufficiently close to the power emitter 16 to enable the temperature of the power emitter 16 to be indicated as a function of the voltage across the junction of the base 14 and the sense emitter 24.

Figure 5:
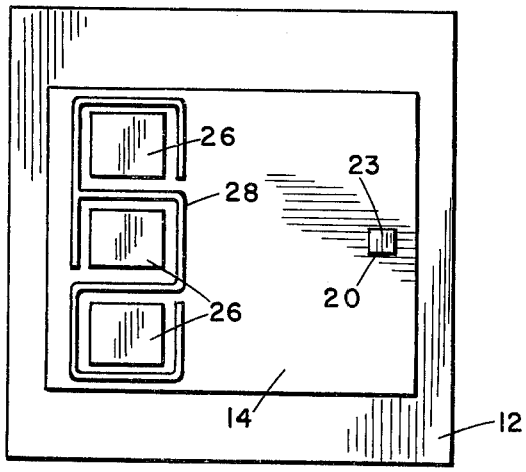
FIG. 5 is a schematic representation of still another preferred embodiment of a power transistor for the system of FIG. 1.

The power transistor of FIG. 5 differs from the power transistor of FIG. 2 in that a plurality of power emitters 26 are contained in the base 14 and a sense emitter 28 is distributed around and between the power emitters 26. The sense emitter 28 is positioned sufficiently close to each of the power emitters 26 to enable the highest instantaneous temperaure at any part of the peripheries of the power emitters 26 to be indicated as a function of the voltage across the junction of the base 14 and the sense emitter 28. The power emitters 26 are connected to a common power emitter terminal (not shown).

Figure 6:
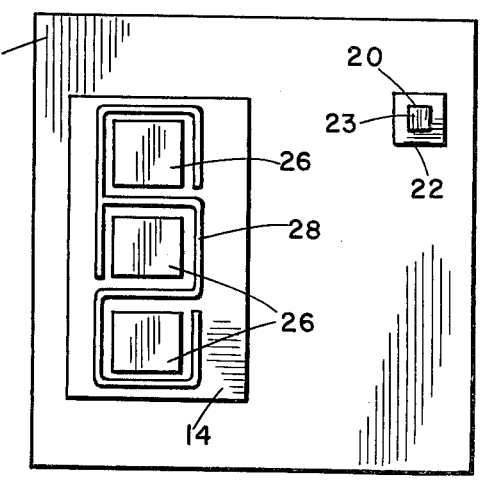
FIG. 6 is a schematic representation of yet another preferred embodiment of a power transistor for the system of FIG. 1.

The transistor of FIG. 6 differs from the power transistors of FIG. 5 in the same manner that FIG. 3 differs from FIG. 2. The reference emitter 20 is in a second base 22, which is separate from the base 14.

Referring again to FIG. 1, by sensing the voltage difference between the sense emitter $e_s$ and the reference emitter $e_r$, an indication is provided of the temperature gradient between the power emitter $e_p$ and the remote position 23 induced by the power dissipated in the power emitter $e_p$. The power emitter $e_p$, the sense emitter $e_s$ and the reference emitter $e_r$ are matched for emitter-base voltage-temperature characteristics as a consequence of being manufactured at the same time. Therefore with equal current densities in the sense emitters $e_s$ and the reference emitter $e_r$, the voltage difference between the sense emitter $e_s$ and the reference emitter $e_r$ is zero volts when no power is being dissipated in the power emitter $e_p$, both the power emitter $e_p$ and the sense emitter $e_s$ are heated and the voltage $V_{be}$ across the junction of the base and the sense emitter $e_s$ decreases. However the reference emitter $e_r$ is positioned remote from the heat dissipated by the power emitter $e_p$; so that the voltage $V_{be}$ across the junction of the base and the reference emitter $e_r$ remains relatively constant as the power emitter $e_p$ is heated. Thus as the temperature of the power emitter $e_p$ increases due to power dissipation in the power emitter $e_p$ the voltage difference between the sense emitter $e_s$ and the reference emitter $e_p$ the voltage difference between the sense emitter $e_s$ and the reference emitter $e_r$ also increases. This voltage difference is proportional to the temperature gradient between the power emitter $e_p$ and the remote position 23 induced by the power dissipated in the power emitter $e_p$.

A differential amplifier 30 has its input terminals respectively coupled to the sense emitter $e_s$ and the reference emitter $e_r$ for sensing the voltage difference between the sense emitter $e_s$ and the reference emitter $e_r$. The negative input terminal of the differential amplifier 30 is connected to the sense emitter $e_s$, and the positive input terminal of the differential amplifier 30 is connected through a bias voltage source E to the reference emitter $e_r$. The output terminal of the operational amplifier 30 is connected through a diode D to the base of the power transistor 10.

Drive current to the base of the power transistor 10 is provided from a current source I. The bias voltage source has a predetermined voltage corresponding to a predetermined temperature gradient indication level. The bias voltage source E biases the differential amplifier. When the voltage difference between the sense emitter $e_s$ and the reference emitter $e_r$ reaches this predetermined voltage, the output of the differential amplifier 30 becomes negative, thereby reducing the drive current to the base of the power transistor 10 from the current source I. Accordingly the power provided to the power transistor 10 is reduced and the power dissipation in the power transistor is limited from increasing.

Since it is known at what temperature levels power transistors may be destroyed, the predetermined bias voltage of the bias voltage source E is selected to correspond to a temperature gradient indication level that enables the system of FIG. 1 to limit the power dissipation in the power transistor 10 to less than a destructive level.

The power transistors shown in FIGS. 2–6 are the subject of applicant's co-pending application filed on Sept. 15, 1977, Application Ser. No. 833,519, cross-referenced hereinabove.

I claim:

1. A system for limiting power dissipation in a power transistor to less than a destructive level; wherein the power transistor includes a base and a power emitter in the base, said system comprising
   means for providing an indication of the temperature gradient between the power emitter and a remote position that would not be heated by the power dissipated in the power emitter; and
   means responsive to said indication of said temperature gradient for limiting power dissipation in the power transistor by reducing the power provided to the power transistor when said indication reaches a predetermined level.

2. A system according to claim 1, wherein the temperature gradient indicating means comprises,
   a sense emitter positioned in the base sufficiently close to the power emitter for enabling the temperature of the power emitter to be indicated as a function of the voltage across the junction of the base and the sense emitter;
   a reference emitter positioned in the base at a remote position that would not be heated by the heat dissipated by the power emitter for enabling the temperature at the remote position to be indicated as a function of the voltage across the junction of the base and the reference emitter; and
   means for sensing the voltage difference between the sense emitter and the reference emitter to provide an indication of said temperature gradient.

3. A system according to claim 2, wherein the sense emitter is distributed around the power emitter for enabling a voltage difference proportional to the maximum instantaneous temperature gradient between the remote position and any part of the periphery of the power emitter to be sensed.

4. A system according to claim 2, wherein a plurality of said power emitters are contained in the base; and the sense emitter is positioned between the power emitters.

5. A system according to claim 4, wherein the sense emitter is distributed around and between the power emitters for enabling a voltage difference proportional to the maximum instantaneous temperature gradient between the remote position and any part of the peripheries of the power emitters to be sensed.

6. A system according to claim 2, wherein the means for limiting power dissipation in the power transistor comprises a differential amplifier having input terminals respectively coupled to the sense emitter and the reference emitter and having an output terminal coupled to the base of the power transistor for controlling the drive current to the base of the power transistor; and a bias potential source having a predetermined voltage corresponding to said predetermined temperature gradient indication level for biasing the differential amplifier to reduce said drive current when said voltage difference between the sense emitter and the reference emitter reaches said predetermined voltage.

7. A system according to claim 1, wherein the power transistor further includes a second base; and the temperature gradient sensing means comprises a sense emitter positioned in the first mentioned base sufficiently close to the power emitter for enabling the temperature of the power emitter to be indicated as a function of the voltage across the junction of the first base and the sense emitter;

a reference emitter positioned in the second base at a remote position that would not be heated by the heat dissipated by the power emitter for enabling the temperature at the remote position to be indicated as a function of the voltage across the junction of the second base and the reference emitter; and means for sensing the voltage difference between the sense emitter and the reference emitter to provide an indication of said temperature gradient.

8. A system according to claim 7, wherein the power transistor further includes a second base; and the temperature gradient sensing means comprises a sense emitter positioned in the first mentioned base sufficiently close to the power emitter for enabling the temperature of the power emitter to be indicated as a function of the voltage across the junction of the first base and the sense emitter;

a reference emitter positioned in the second base at a position remote from the heat dissipated by the power emitter for enabling the temperature at the remote position to be indicated as a function of the voltage across the junction of the second base and the reference emitter; and means for sensing the voltage difference between the sense emitter and the reference emitter to provide an indication of said temperature gradient.

9. A system according to claim 7, wherein a plurality of said power emitters are contained in the first base; and the sense emitter is positioned between the power emitters.

10. A system according to claim 9, wherein the sense emitter is distributed around and between the power emitters for enabling a voltage difference proportional to the maximum instantaneous temperature gradient between the remote position and any part of the peripheries of the power emitters to be sensed.

11. A system according to claim 7, wherein the means for limiting power dissipation in the power transistor comprises a differential amplifier having input terminals respectively coupled to the sense emitter and the reference emitter and having an output terminal coupled to the base of the power transistor for controlling the drive current to the base of the power transistor; and a bias potential source having a predetermined voltage corresponding to said predetermined temperature gradient indication level for biasing the differential amplifier to reduce said drive current when said voltage difference between the sense emitter and the reference emitter reaches said predetermined voltage.

* * * * *